United States Patent [19]

Susak et al.

[11] Patent Number: 4,922,208

[45] Date of Patent: May 1, 1990

[54] OUTPUT STAGE FOR AN OPERATIONAL AMPLIFIER

[75] Inventors: David M. Susak, Chandler; Robert L. Vyne, Tempe, both of Ariz.

[73] Assignee: Motorola, Inc., Schaumburg, Ill.

[21] Appl. No.: 334,430

[22] Filed: Apr. 7, 1989

[51] Int. Cl.[5] .......................... H03F 3/26; H03F 3/45
[52] U.S. Cl. .................................... 330/255; 330/270; 330/273
[58] Field of Search ............... 330/252, 255, 257, 262, 330/267, 270, 271, 273, 311

[56] References Cited

U.S. PATENT DOCUMENTS 4,499,431 2/1985 Otala ........................... 330/270 X Primary Examiner—Steven Mottola
Attorney, Agent, or Firm—Michael D. Bingham

[57] ABSTRACT

In an output stage of an operational amplifier comprising first and second NPN output transistors a circuit is coupled between the positive supply conductor and the collector of the first NPN transistor for providing a boosted base current drive thereto as a function of the load current sourced from the emitter of the first transistor to the output of the operational amplifier. The circuit senses the collector current flowing through the first transistor for increasing the base current drive thereto as the collector current increases.

4 Claims, 1 Drawing Sheet

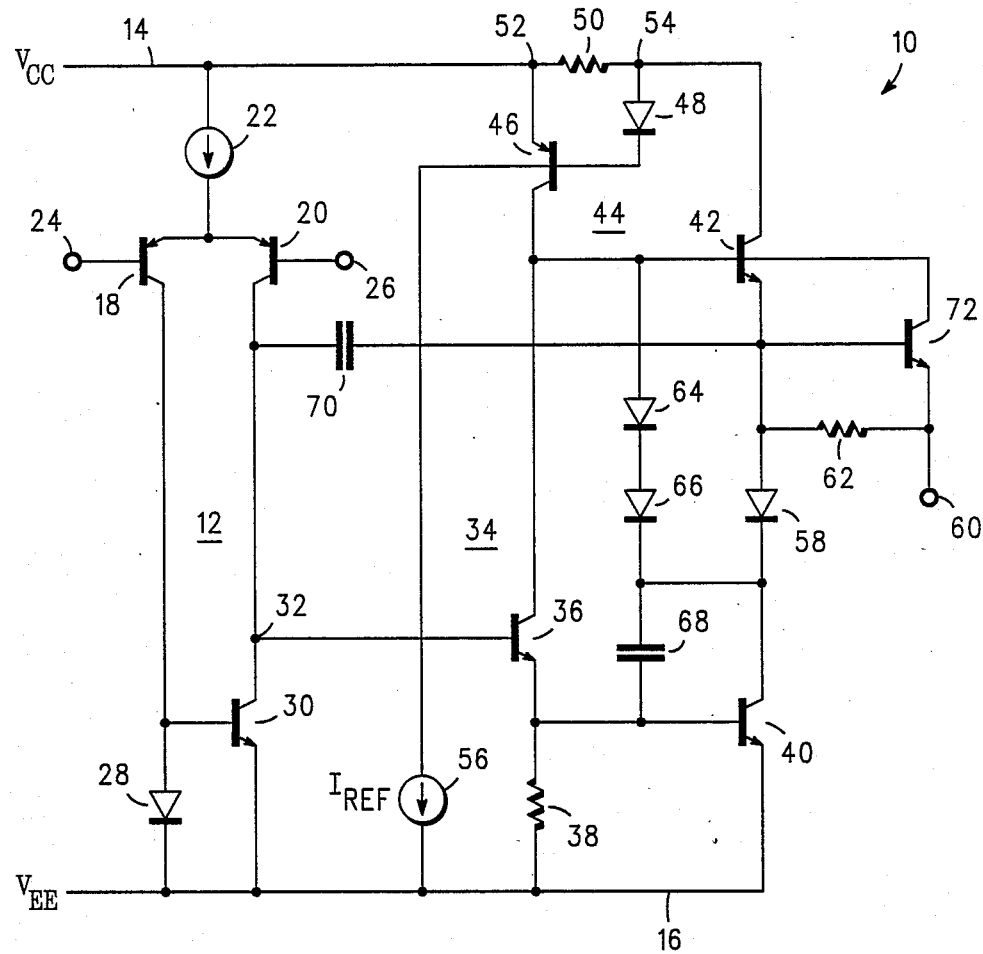

OUTPUT STAGE FOR AN OPERATIONAL AMPLIFIER

BACKGROUND OF THE INVENTION

The present invention relates to operational amplifiers and, more particularly, to an integrated operational amplifier having an all NPN output stage including circuitry for increasing the magnitude of the current sourced to the output of the amplifier.

An all NPN output stage for operational amplifiers (op-amps) is well known in the art. In todays marketplace there are many applications for such op-amps which have low power consumption in order, for example, to be utilized in battery operated systems. The problem with most if not all prior art low power op-amps is that they can not drive small resistive loads, i.e., loads of 600 ohms or less because of limited ability to source sufficient load current while maintaining minimum drain current in the quiescent operating mode.

Thus, a need exists for a low power operational amplifier having means for boosting the output source current as a function of the load while maintaining low power drain.

SUMMARY OF THE INVENTION

It is an object of the present invention to provide a circuit suitable for providing a boosted output current which is function of a load coupled thereto.

It is another object of the present invention to provide an improved operational amplifier.

It is a further object of the present invention to provide an operational amplifier having a current boosted output stage.

A still further object of the present invention is to provide an improved operational amplifier having an output stage for sourcing a load current which is driven by a current boost circuit which increases the drive current to the output stage as a function of the load current.

In accordance with the above and other objects there is provided an output stage of an operational amplifier comprising first and second NPN output transistor; a circuit coupled between the positive supply conductor and the collector of the first NPN transistor for providing a boosted base current drive thereto as a function of the load current sourced from the emitter of the first transistor to the output of the operational amplifier wherein the circuit senses the collector current flowing through the first transistor for increasing the base current drive thereto as the collector current increases.

BRIEF DESCRIPTION OF THE DRAWING

The SINGLE FIGURE is a schematic diagram of the present invention.

DETAILED DESCRIPTION OF THE PREFERRED EMBODIMENT

Turning to the single drawing there is shown op-amp 10 including a typical input stage 12 for receiving a differential input signal. Input stage 12 is coupled between power supply conductors 14 and 16 at which Vcc and Vee are respectively applied and, as shown, includes a differential amplifier comprised of PNP transistors 18 and 20, the emitters of which are differentially coupled to current supply 22, the latter of which is coupled to power supply conductor 14. In response to a differential input signal applied to inputs 24 and 26, to the bases of transistors 18 and 20 respectively, differentially related currents flow in the collectors thereof which are coupled to a differential to single ended converter circuit for providing a single output signal at node 32. The differential to single ended converter circuit comprises diode 28 and transistor 30 coupled between output node 32 and power supply conductor 16 in a conventional manner. Suffice it to say that if the differential input voltage applied to input 24 is less than the voltage applied at input 26, current drive to the output node 32 is diverted through transistor 30 while if the reverse input condition occurs base current drive is sourced to the output node.

For purposes of discussion, the output of input stage 12 taken at node 32 is considered to be coupled to the input of the output stage 34 at the base of transistor 36. Transistor 36 is configured as an emitter follower having its emitter coupled via resistor 38 to power supply conductor 16 and to the base of output NPN transistor 40. The collector of transistor 36 is coupled to the base of upper output NPN transistor 42. As will be referred to later, transistors 40 and 42 comprise a well known NPN output drive stage of op-amp 10. A current boost circuit 44 of the preferred embodiment is shown coupled between power supply conductor 14 and the collector of transistor 42 and having an output for supplying boosted base current drive to the base of the latter transistor. Current boost circuit 44 of the present invention includes transistor 46 having its emitter-collector conduction path coupled between node 52 and both the collector of transistor 36 and the base of transistor 42 while its base is coupled to the cathode of diode 48, the anode of which is returned to node 54. Node 52 is coupled to power supply conductor 14 and, via resistor 50, to the collector of transistor 42 at node 54. Current supply 56 is coupled between the base of transistor 46 and power supply conductor 16 for sinking a reference current Iref. As known, diode means 48 may be realized by utilizing a transistor having its emitter coupled to node 54 and its base-collector electrodes coupled to the base of transistor 46.

The collector of output transistor 40 is coupled via diode means 58 to the emitter of output transistor 42 and via resistor 62 to output terminal 60 of op-amp 10. A pair of diode means 64 and 66 are coupled between the base of transistor 42 and the collector of transistor 40 the latter of which is coupled to its base through Miller loop compensating capacitor 68. A conventional Miller feedback loop is shown comprising capacitor 70. A protection transistor 72 is utilized having its collector-emitter conduction path coupled between the base of transistor 42 and output 60 and its base coupled to the emitter of transistor 42.

In a quiescent operating state, assuming that the value of resistor 50 is small, i.e., on the order of four ohms, current boost circuit 44 essentially functions as a current mirror to provide quiescent bias current at the collector of transistor 46. The connection of diodes 64 and 66 in parallel to the base-emitter of transistor 42 and diode 58 also functions as a common current mirror whereby the current sourced from the collector of transistor 46 is mirrored through the collector-emitter conduction path of transistor 42. This standby or quiescent current can be very small; approaching the value of Iref.

In the sourcing mode of operation where transistor 36 is tended to be turned off and NPN transistor 42 is turned on, current boost circuit 44 will effectively sense the load current, the collector-emitter current of transistor 42, to supply a current to the base of the latter device the magnitude of which increases as the load current demand increases. Hence, as the load current increases, the collector current flow through transistor 42 increases which increases the voltage drop across resistor 50. Transistor 46 will thus become more conductive as the voltage drop across resistor 50 increases to source increasing base current drive to output drive transistor 42 rendering it more conductive to supply larger load currents sufficient to drive small loads, for example, 600 ohms or less. Thus, the combination of current boost circuit 44 and the current efficient output stage comprising NPN transistors 42 and 40 as well as diodes 58, 66 and 68 is capable of driving small loads while having small quiescent power drain. Miller compensation capacitor 68 compensates the Miller feedback loop including capacitor 70, as is well known, to reduce undesirable high frequency peaking. Transistor 72 is utilized for conventional current limiting and to prevent the base-emitter junction of transistor 42 from Zenering in the sink mode of operation of op-amp 10 when the output voltage is pulled low.

It is noted that current boosting is not required in the load current sink mode as transistor 40 is turned on due to the action of transistor 72. When the base current of transistor 40 becomes greater than the current that can be supplied from the collector of transistor 46, additional base current can be supplied from the output via resistor 62 through the collector-base junction of transistor 72 which becomes forward biased in this condition.

As realized, current boost circuit 44 described above forms a current mirror in the same manner as the connection of diode 28 and transistor 30 as is well understood to those skilled in the art. As such it is well within the knowledge of those in the art that resistors could be added in the current paths of the emitter of transistor 46 and diode means 48 to provide current ratioing and adjustment of the collector current provided from transistor 46. Additionally, a resistor could be coupled between the base of transistor 46 and the cathode of diode 48 to ratio the collector current of transistor 46 with respect to Iref.

Hence, what has been described is a novel output stage comprising the combination of a current boost circuit and all NPN transistor driver output stage capable of driving smaller loads than similar op-amp output stages while reducing the power drain of the op-amp. The novel boosted current source senses the load current flowing through the transistor driver during the sourcing current mode of operation to provide increased base current drive to the transistor driver which is the function of the increased load current.

What is claimed is:

1. An output stage for an operational amplifier for providing load current to an output terminal in response to a drive signal supplied to the input thereof, comprising:
   an output driver stage including first and second NPN transistors each having a base, collector and an emitter, said emitter of said first NPN transistor being coupled to the output terminal for sourcing current thereto and said collector of said second NPN transistor being coupled to the output terminal for sinking current therefrom, said emitter of said second NPN transistor being coupled to a first power supply conductor;
   an emitter follower configured transistor coupled between the input of the output stage and said bases of said first and second NPN transistors; and
   circuit means coupled between a second power supply conductor and said collector of said first NPN transistor for supplying base current drive thereto the magnitude of which is a function of the collector current flowing through said first transistor and which increases as the load current supplied by said first transistor to the output terminal increases.

2. The output stage of claim 1 comprising:
   first diode means coupled between said emitter and collector of said first and second NPN transistors respectively;
   means for coupling said emitter of said first NPN transistor to the output terminal; and
   additional diode means coupled between said base and collector of said first and second NPN transistors respectively.

3. The output stage of claim 1 wherein said circuit means includes:
   first resistive means coupled between said second power supply conductor and said collector of said first NPN transistor;
   an additional transistor having a base and emitter-collector conduction path coupled between said second power supply conductor and said base of said first NPN transistor;
   a first diode coupled between said collector of said first NPN transistor and said base of said additional transistor; and
   a current supply coupled between said base of said additional transistor and said first power supply conductor for providing a reference current.

4. The output stage of claim 3 including:
   a second diode coupled between said emitter and collector of said first and second NPN transistors respectively; and
   at least a pair of diodes coupled in series between said base and collector of said first and second NPN transistors respectively.

* * * * *